US012733490B2

(12) United States Patent
Akiba et al.

(10) Patent No.: US 12,733,490 B2
(45) Date of Patent: Sep. 8, 2026

(54) ELECTRONIC CONTROL DEVICE

(71) Applicant: Hitachi Astemo, Ltd., Hitachinaka (JP)

(72) Inventors: Ryo Akiba, Hitachinaka (JP); Yoshio Kawai, Hitachinaka (JP); Keiko Ueno, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 373 days.

(21) Appl. No.: 18/559,153

(22) PCT Filed: Feb. 7, 2022

(86) PCT No.: PCT/JP2022/004637

§ 371 (c)(1),
(2) Date: Nov. 6, 2023

(87) PCT Pub. No.: WO2023/021725

PCT Pub. Date: Feb. 23, 2023

(65) Prior Publication Data

US 2024/0249993 A1 Jul. 25, 2024

(30) Foreign Application Priority Data

Aug. 19, 2021 (JP) ................................ 2021-133925

(51) Int. Cl.
*H10W 40/22* (2026.01)

(52) U.S. Cl.
CPC .................................. *H10W 40/22* (2026.01)

(58) Field of Classification Search
CPC . H10W 40/22; H05K 7/2039; H05K 7/20436; H05K 7/20454; H05K 7/20463; H05K 7/20481; H05K 7/20518
See application file for complete search history.

(56) References Cited

U.S. PATENT DOCUMENTS 6,437,438 B1 * 8/2002 Braasch ................ H01L 23/367 257/E23.102
6,445,594 B1 * 9/2002 Nakagawa .............. H01L 23/13 257/784

(Continued)

FOREIGN PATENT DOCUMENTS

JP 2002289751 A * 10/2002
JP 2013-197405 A 9/2013

(Continued)

OTHER PUBLICATIONS

JP-2002289751-A Translation (Year: 2002).*
International Search Report (PCT/ISA/210) issued in PCT Application No. PCT/JP2022/004637 dated May 10, 2022 with English translation (4 pages).

(Continued)

*Primary Examiner* — Jayprakash N Gandhi
*Assistant Examiner* — Matthew Sinclair Muir
(74) *Attorney, Agent, or Firm* — Crowell & Moring LLP

(57) ABSTRACT

An electronic control device capable of achieving both high heat dissipation and solder connection reliability is achieved. An electronic control device 101 includes a circuit board 3 mounted with an electronic component 7 and a connector 4, a base 1 housing this circuit board 3, a cover 2 closing this base 1, a heat dissipation pedestal 9 formed on the base 1, and a thermally conductive material 8 arranged on an upper surface of this heat dissipation pedestal 9. On the upper surface of the heat dissipation pedestal 9 on which the thermally conductive material 8 is arranged, a plurality of grooves 14 formed radially from the center of the upper surface of the heat dissipation pedestal 9 and where the thermally conductive material 8 enters are formed. The electronic component 7 is configured to be in contact with the heat dissipation pedestal 9 via the thermally conductive material 8. This can achieve an electronic control device capable of achieving both high heat dissipation and solder connection reliability.

15 Claims, 11 Drawing Sheets

(56) References Cited

U.S. PATENT DOCUMENTS

| | | | | |
|---|---|---|---|---|
| 7,282,799 | B2 * | 10/2007 | Brunschwiler | H01L 23/3733<br>438/106 |
| 9,277,681 | B2 * | 3/2016 | Kawai | H05K 7/20854 |
| 2007/0268671 | A1 * | 11/2007 | Brandenburg | H01L 23/3675<br>257/E25.012 |
| 2008/0296757 | A1 * | 12/2008 | Hoffman | H01L 23/42<br>257/713 |
| 2010/0246133 | A1 * | 9/2010 | Schmidt | H01L 23/367<br>361/705 |
| 2013/0250521 | A1 | 9/2013 | Kawai et al. | |
| 2016/0240456 | A1 | 8/2016 | Yoshimura et al. | |
| 2024/0164066 | A1 * | 5/2024 | Watanabe | H01L 23/36 |

FOREIGN PATENT DOCUMENTS

| | | | |
|---|---|---|---|
| JP | 2017-130514 | A | 7/2017 |
| WO | WO 2015/097874 | A1 | 7/2015 |

OTHER PUBLICATIONS

Japanese-language Written Opinion (PCT/ISA/237) issued in PCT Application No. PCT/JP2022/004637 dated May 10, 2022 with English translation (7 pages).

International Preliminary Report on Patentability (PCT/IB/338 & PCT/IB/373) issued in PCT Application No. PCT/JP2022/004637 dated Feb. 29, 2024, including Japanese- language Written Opinion (PCT/ISA/237) dated May 10, 2022 with English translation (6 pages).

* cited by examiner

ELECTRONIC CONTROL DEVICE

TECHNICAL FIELD

The present invention relates to an electronic control device.

BACKGROUND ART

In recent years, high functionality of in-vehicle electronic control devices has been accelerated with an increase in autonomous driving and preventive safety functions, and the amount of heat generated by electronic components (microcomputers and the like) mounted on the electronic control devices has increased.

As means for suppressing a temperature rise of an electronic component, a heat dissipation structure with a thermally conductive material as disclosed in PTL 1 is known. In the technique disclosed in PTL 1, a first thermally conductive material is interposed between an upper surface of a first heat generating component among a plurality of heat generating components and a heat sink, and a second thermally conductive material is interposed between a back surface of a second heat generating component and the heat sink, so that a large mounting area of a circuit board is ensured while heat dissipation efficiency is increased.

CITATION LIST

Patent Literature

PTL 1: JP 2017-130514 A

SUMMARY OF INVENTION

Technical Problem

In the technique disclosed in PTL 1, the first thermally conductive material and the second thermally conductive material can suppress temperature rise of the electronic component. Here, by increasing the amount of filler contained in the thermally conductive material, the thermal conductivity of the thermally conductive material is increased, and the heat dissipation can be improved.

However, on the other hand, when the amount of filler increases, the viscosity or hardness of the thermally conductive material increases, and the thermally conductive material pushes up the electronic component, thereby causing warpage of the circuit board. Although an electronic component such as a semiconductor chip and the circuit board are electrically connected by solder, a stress is generated in a solder bump due to the warpage generated in the circuit board, and there is a possibility that the electronic component is finally damaged by a crack that develops due to an environmental temperature change during assembly or after the assembly.

In order to avoid this, it is also possible to widen the heat dissipation clearance of the thermally conductive material, but the thermal resistance between the electronic component and a base increases, and thus the heat dissipation is deteriorated. For this reason, it is difficult to ensure both high heat dissipation and solder connection reliability.

An object of the present invention is to achieve an electronic control device capable of achieving both high heat dissipation and solder connection reliability.

Solution to Problem

In order to achieve the above object, the present invention is configured as follows.

An electronic control device includes: a circuit board mounted with an electronic component and a connector; a base housing the circuit board; a cover closing the base; a heat dissipation pedestal formed on the base; and a thermally conductive material arranged on an upper surface of the heat dissipation pedestal, in which a plurality of grooves formed radially from a center of the upper surface of the heat dissipation pedestal and where the thermally conductive material enters are formed on an upper surface of the heat dissipation pedestal on which the thermally conductive material is arranged, and the electronic component is in contact with the heat dissipation pedestal via the thermally conductive material.

Advantageous Effects of Invention

According to the present invention, it is possible to prevent breakage of an electronic component even when a thermally conductive material having high thermal conductivity containing a large amount of filler is used, and therefore it is possible to ensure both high heat dissipation and solder connection reliability.

DESCRIPTION OF EMBODIMENTS

Figure 1:
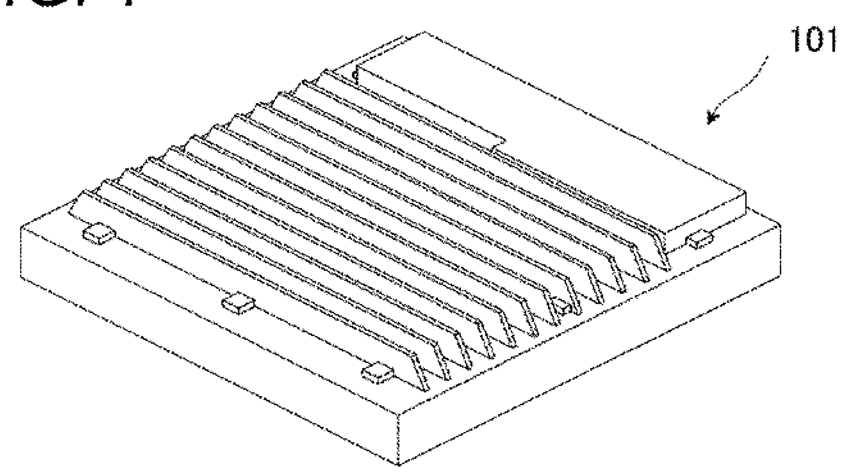
FIG. 1 is an external perspective view of an electronic control device in Example 1.

Hereinafter, an embodiment of an electronic control device related to the present invention will be described in detail with reference to the accompanying drawings.

In the drawings, the same reference signs denote the same parts.

EXAMPLES

Example 1

Figure 2:
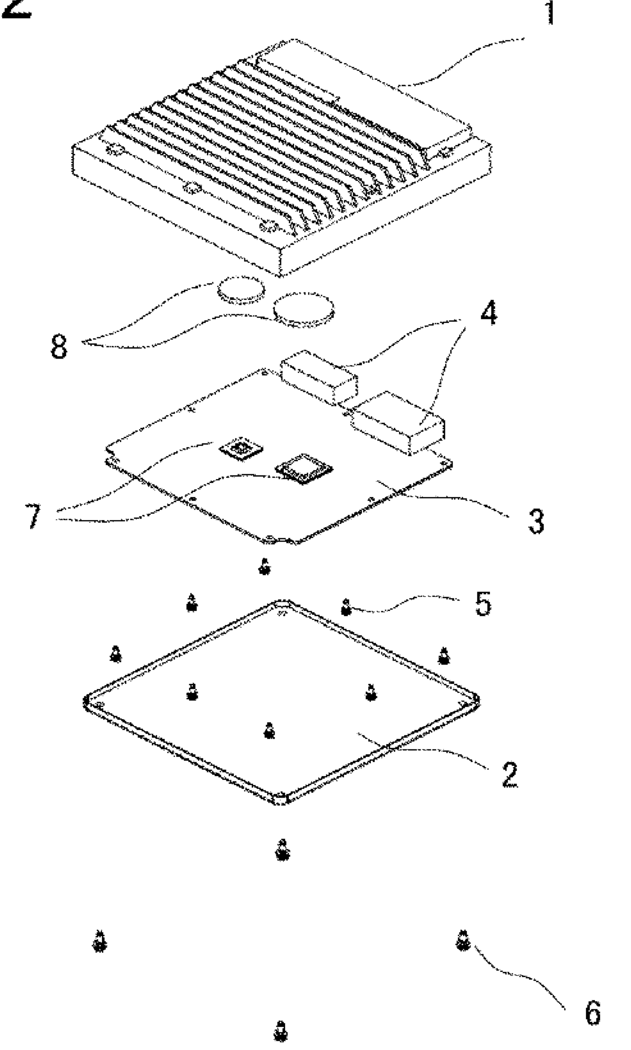
FIG. 2 is an exploded perspective view of the electronic control device in Example 1.

FIG. 1 is an external perspective view of an electronic control device 101 in Example 1 of the present invention. FIG. 2 is an exploded perspective view of the electronic control device 101, and FIG. 3 is a perspective view of the exploded perspective view illustrated in FIG. 2 as viewed from a vertically opposite side.

Figure 3:
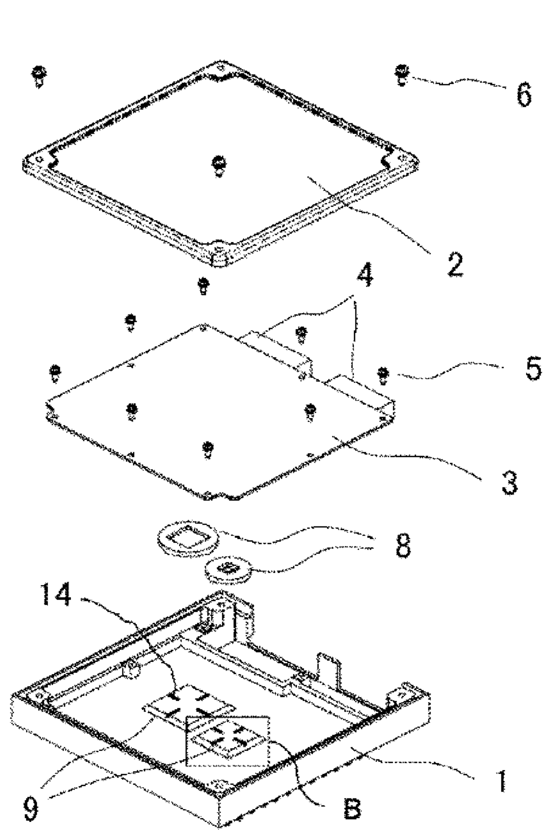
FIG. 3 is a perspective view of the exploded perspective view illustrated in FIG. 2 as viewed from a vertically opposite side.

In FIGS. 1, 2, and 3, the electronic control device 101 is mounted on, for example, an automobile and used for controlling an engine, a transmission, a brake, and the like.

The electronic control device 101 is roughly composed of a circuit board 3 mounted with an electronic component 7, a connector 4 mounted on the circuit board 3 and electrically connecting an electric circuit formed on the circuit board 3 and an external device, a base 1 housing the circuit board 3, and a cover 2 covering the circuit board 3 housed in the base 1 and closing the base 1.

In addition to the illustrated electronic component 7, a plurality of electronic components are actually mounted on the circuit board 3. The circuit board 3 is held by the base 1 with, for example, a board fixing screw 5 or the like. The cover 2 is held by the base 1 with, for example, a cover fixing screw 6 or the like. By arranging a the thermally conductive material 8 such as grease between the electronic component 7 and the base 1 or between the circuit board 3 and the base 1, it is possible to suppress temperature rise of the electronic component. The thermally conductive material 8 is arranged on an upper surface of a heat dissipation pedestal 9.

Figure 4:
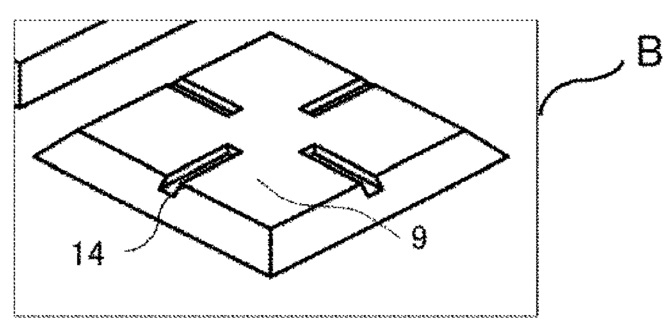
FIG. 4 is an enlarged view of a region B illustrated in FIG. 3.
Figure 5:
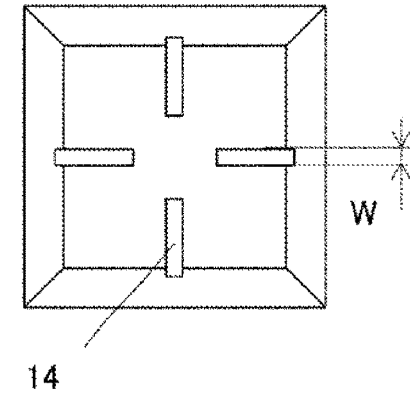
FIG. 5 is a top view of a heat dissipation pedestal.
Figure 6:
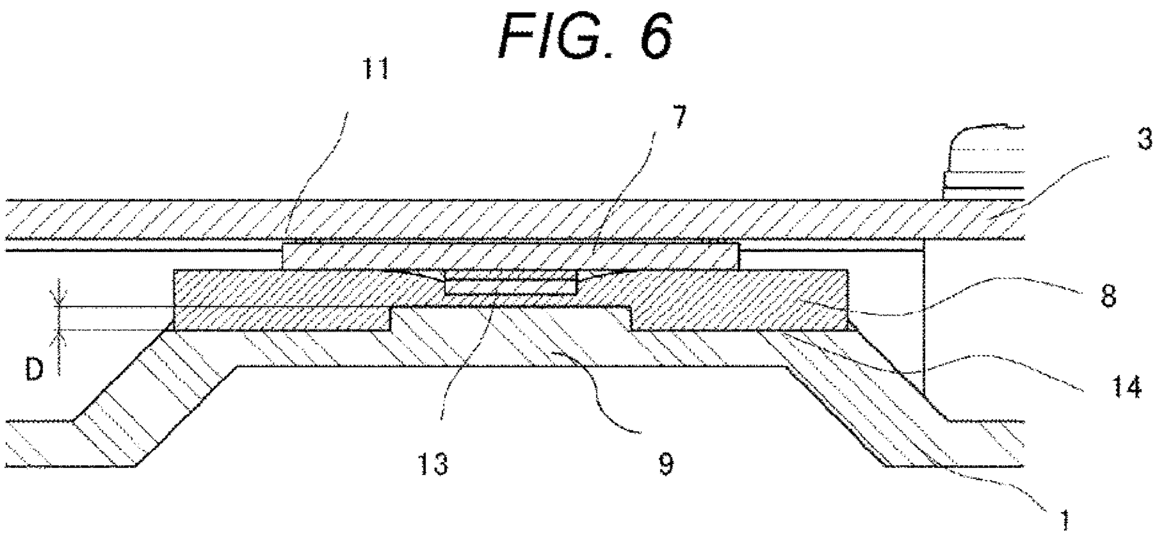
FIG. 6 is a partial cross-sectional view in a case where the electronic control device is assembled.

As illustrated in FIG. 3, the heat dissipation pedestal 9 is formed on the base 1, and a plurality of grooves 14 are formed on the heat dissipation pedestal 9. FIG. 4 is an enlarged view of the region B illustrated in FIG. 3, and FIG. 5 is a top view of the heat dissipation pedestal 9. FIG. 6 is a partial cross-sectional view in a case where the electronic control device 101 is assembled, and is a view illustrating the connection relationship among the electronic component 7, the thermally conductive material 8, the heat dissipation pedestal 9, and the groove 14.

As illustrated in FIGS. 4 and 5, four grooves 14 are formed on the heat dissipation pedestal 9. The four grooves 14 are formed in a cross shape in a state of not being formed in a center region of the heat dissipation pedestal 9. That is, two grooves 14 substantially parallel to two sides of the heat dissipation pedestal 9 facing each other are formed via the center region of the heat dissipation pedestal 9. Since the heat dissipation pedestal 9 has a quadrangular shape and has two sets of two sides facing each other, the four grooves 14 are formed via the center region.

The electronic component 7 is in contact with the heat dissipation pedestal 9 via the thermally conductive material 8. The thermally conductive material 8 is arranged to also enter the groove 14 formed on the heat dissipation pedestal 9. Heat of the electronic component 7 is transmitted to the heat dissipation pedestal 9 via the thermally conductive material 8. Since the thermally conductive material 8 is also arranged in the groove 14, the heat dissipation area from the thermally conductive material 8 to the heat dissipation pedestal 9 is enlarged, and the heat dissipation effect is improved.

This improvement in the heat dissipation effect makes it possible to reduce a force (reaction force) that pushes up the electronic component 7 by the thermally conductive material 8.

This can ensure solder connection reliability of the electronic component without increasing a heat dissipation clearance between the heat dissipation pedestal 9 and the electronic component 7.

Since the thermal resistance of the upper part of a semiconductor chip 13 (arranged on the electronic component 7 as illustrated in FIG. 6) having a high heat generation density does not change depending on the presence or absence of the groove 14, high heat dissipation can be achieved at the same time. The thermally conductive material 8 contains a filler 10.

At this time, as the content of the filler 10 (illustrated in FIG. 8) in the thermally conductive material 8 increases, the viscosity of the thermally conductive material 8 increases, and the thermally conductive material 8 is less likely to enter groove 14. When the volume ratio of the filler 10 in the thermally conductive material 8 is ν, a groove width W necessary for the thermally conductive material 8 to enter the groove 14 can be defined as $W=0.06\nu$(mm).

That is, when the volume ratio of the filler 10 contained in the thermally conductive material 8 is ν (vol %) with respect to the entire volume of the thermally conductive material 8, the groove width W of each of the plurality of grooves 14 is at least $0.06\nu$ (mm).

On the other hand, as the content of the filler 10 increases, the hardness of the thermally conductive material 8 increases, and cracks are likely to develop in a solder bump 11 due to an environmental temperature change during assembly or after the assembly.

A groove depth D of the groove 14 necessary for preventing this can be defined as $D=0.008\nu+0.5$ (mm). That is, the thermally conductive material 8 contains the filler 10, and when the volume ratio of the filler 10 contained in the thermally conductive material 8 is ν (vol %) with respect to the entire volume of the thermally conductive material 8, the groove depth D of each of the plurality of grooves 14 is at least $0.008\nu+0.5$ (mm).

By forming the groove 14 set to have the groove width W and the groove depth D or more, it is possible to achieve an electronic control device capable of achieving both high heat dissipation and solder connection reliability.

Figure 7:
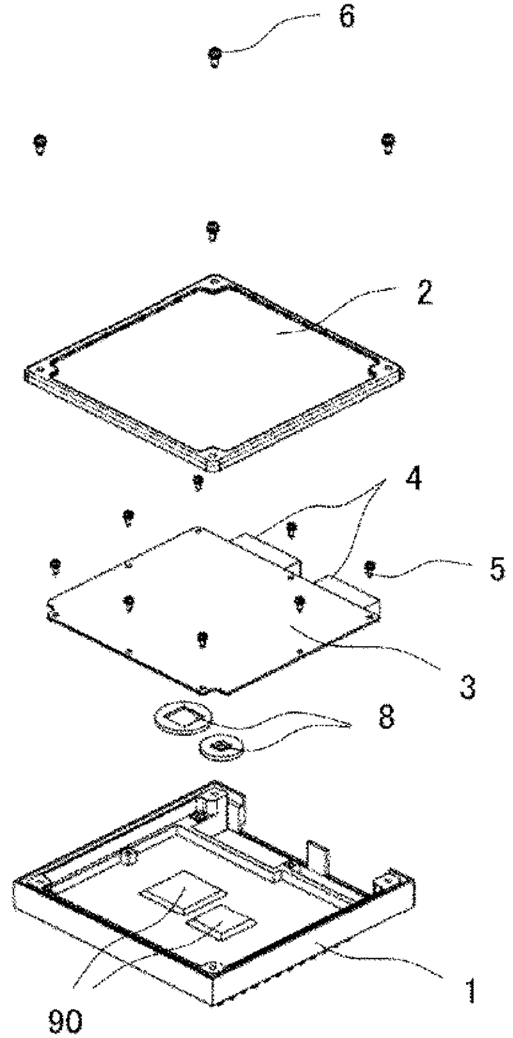
FIG. 7 is an exploded perspective view of an example including a heat dissipation pedestal in which a groove is not formed unlike the present invention.

FIG. 7 is an exploded perspective view of an example including the heat dissipation pedestal 90 in which the groove 14 is not formed unlike the present invention, and is an example for comparison with the present invention.

Figure 8:
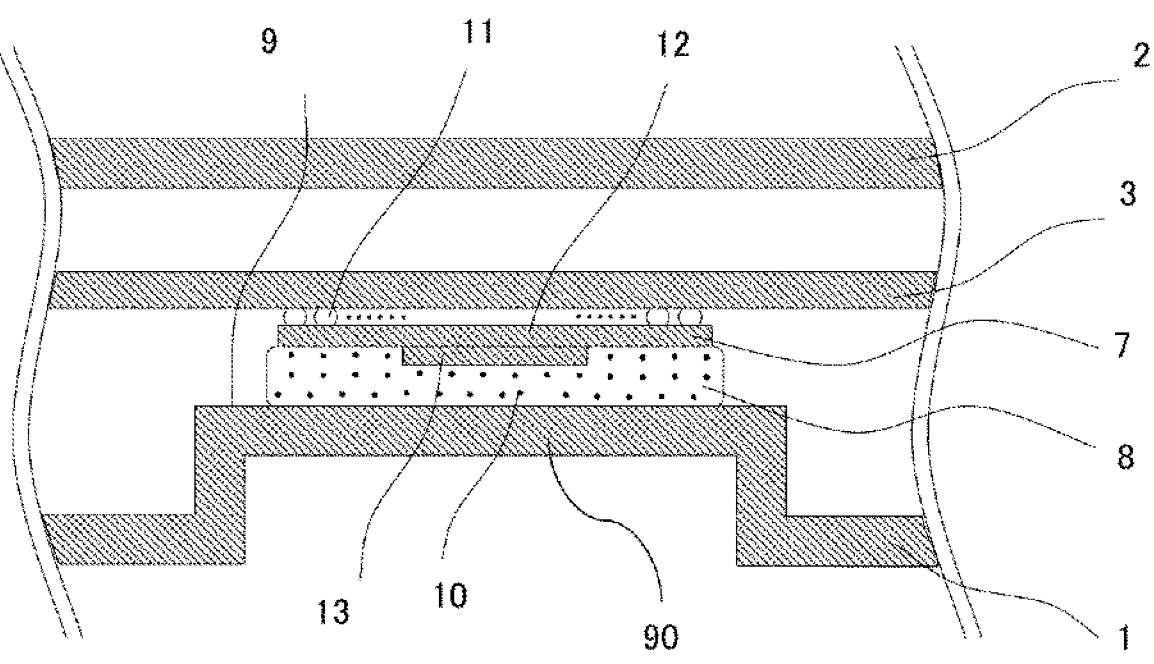
FIG. 8 is a cross-sectional view of a main part of the example of FIG. 7.
Figure 9:
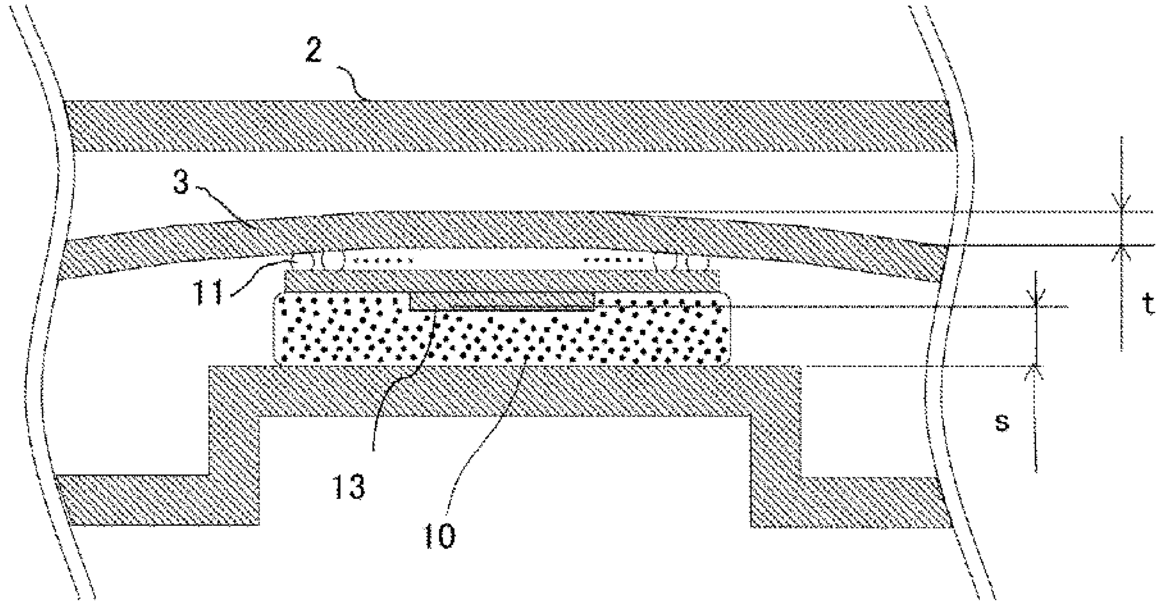
FIG. 9 is a cross-sectional view of the main part of the example of FIG. 7.

In the example illustrated in FIG. 7, as illustrated in FIG. 8, by increasing the amount of the filler 10 contained, it is possible to increase the thermal conductivity of the thermally conductive material 8, and improve the heat dissipation. However, on the other hand, when the amount of the filler 10 increases, the viscosity or hardness of the thermally conductive material 8 increases, and as illustrated in FIG. 9, the thermally conductive material 8 pushes up the electronic component 7, thereby causing warpage t in the circuit board 3.

The electronic component 7 has a package structure such as a BGA, for example, from the viewpoint of mounting density improvement, and the semiconductor chip 13 and the circuit board 3 are electrically connected via an interposer 12 by the solder bump 11. However, stress is generated in the solder bump 11 due to the warpage t generated in the circuit board 3, and there is a possibility that the electronic component 7 is finally damaged by a crack developed due to an environmental temperature change during assembly or after the assembly.

In order to avoid this, it is also possible to widen a heat dissipation clearance s, but the thermal resistance between the electronic component 7 and the base 1 increases, and thus the heat dissipation decreases.

For this reason, in the example illustrated in FIG. 7 different from the present invention, that is, the example in which the groove 14 is not formed on the heat dissipation pedestal 9, it is difficult to ensure both high heat dissipation and solder connection reliability.

Example 2

Next, Example 2 of the present invention will be described.

Figure 10:
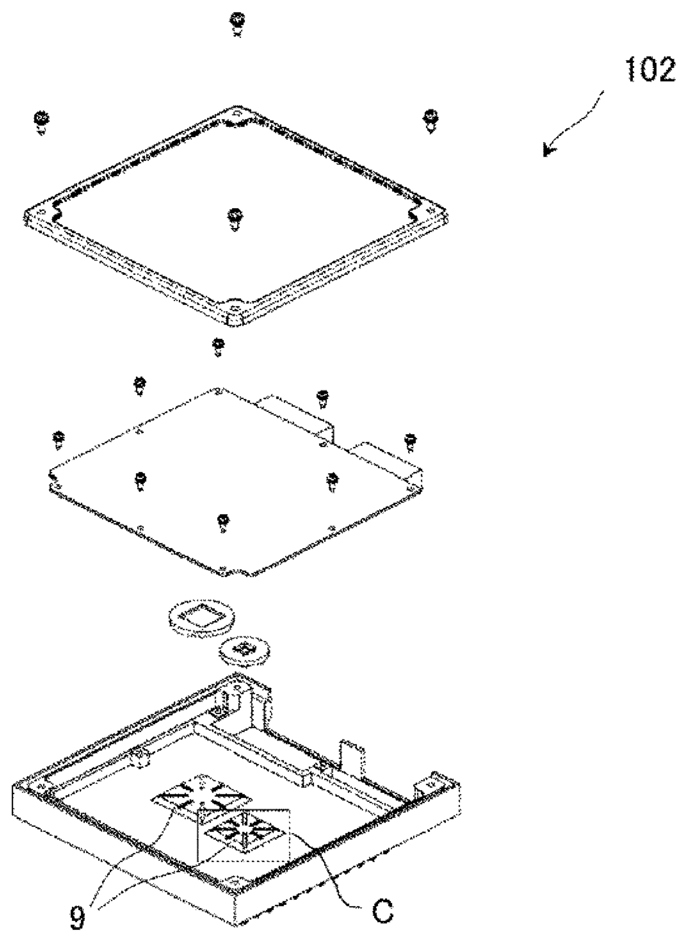
FIG. 10 is an exploded perspective view of an electronic control device in Example 2.

FIG. 10 is an exploded perspective view of an electronic control device 102 in Example 2 and corresponds to FIG. 3, which is an exploded perspective view in Example 1. In Example 2, FIGS. 1 and 2 in Example 1 are the same as those in Example 2, and thus illustration and detailed description will be omitted.

Figure 11:
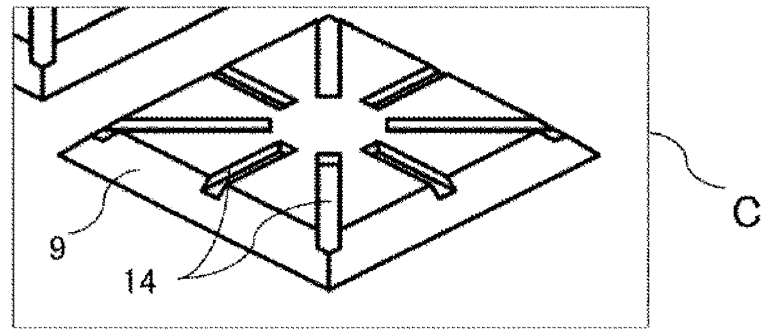
FIG. 11 is an enlarged view of a region C illustrated in FIG. 10.
Figure 12:
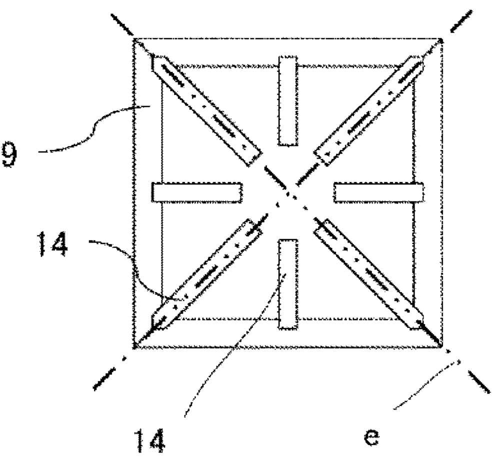
FIG. 12 is a top view of a heat dissipation pedestal of Example 2.

FIG. 11 is an enlarged view of the region C illustrated in FIG. 10, and FIG. 12 is a top view of the heat dissipation pedestal 9 of Example 2.

Example 2 is characterized in that a groove 14 is further formed on a diagonal line e of the heat dissipation pedestal 9 in addition to the groove 14 formed on the heat dissipation pedestal 9 in Example 1. The four grooves 14 formed on the diagonal line e are formed to have a cross shape in a state of not being formed in the center region of the heat dissipation pedestal 9. Eight grooves 14 in Example 2 are formed on the surface of the heat dissipation pedestal 9.

Figure 13:
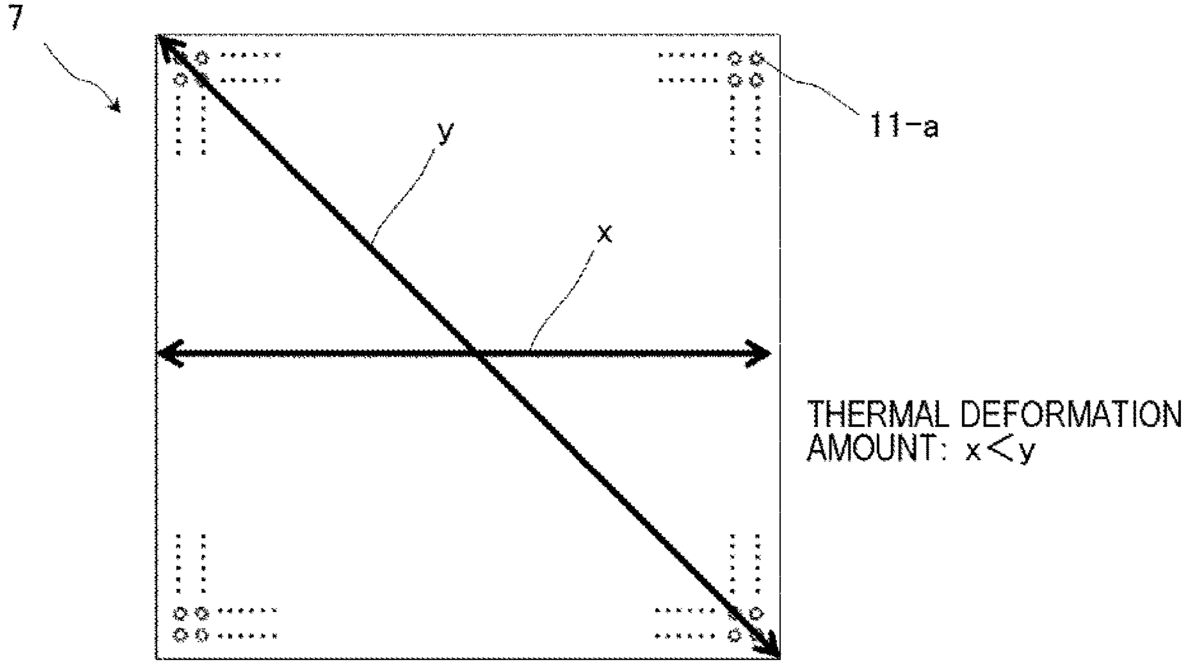
FIG. 13 is a view explaining thermal expansion in the electronic component.

FIG. 13 is a view explaining thermal expansion in the electronic component 7.

Refer to FIG. 13. In the electronic component 7, since a deformation length y on the diagonal line is the largest in the expansion/contraction due to the environmental temperature change as compared with a lateral deformation length× parallel to the side of the electronic component 7 and other directions, a solder bump 11-*a* at the corner end of the electronic component 7 has the shortest solder life.

Therefore, by forming the groove 14 on the heat dissipation pedestal 9 and arranging the thermally conductive material 8 at the position corresponding to the diagonal 1 line of the electronic component 7, it is possible to make it difficult to transmit the stress generated by the thermal deformation of the base 1 to the solder bump 11-*a* at the corner end of the electronic component 7, and it is possible to improve the solder connection reliability of the electronic component 7.

The groove width W and the groove depth D of the groove 14 in Example 2 are equivalent of those of Example 1.

According to Example 2, in addition to the same effects as those in Example 1, the solder connection reliability of the electronic component 7 can be further improved.

Example 3

Next, Example 3 of the present invention will be described.

Figure 14:
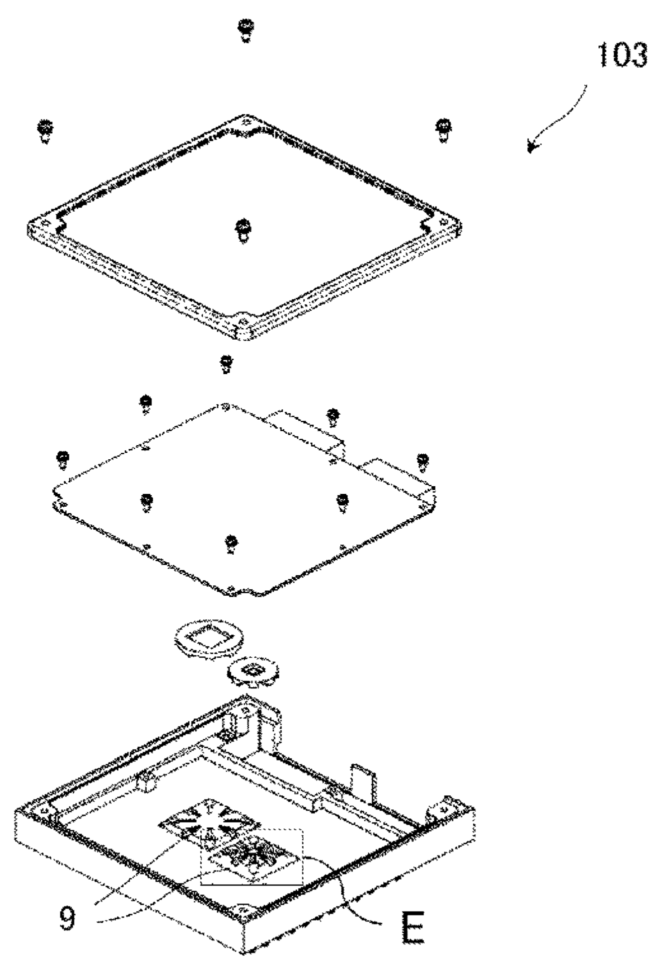
FIG. 14 is an exploded perspective view of an electronic control device in Example 3.

FIG. 14 is an exploded perspective view of an electronic control device 103 in Example 3 and corresponds to FIG. 3, which is an exploded perspective view in Example 1. In Example 3, FIGS. 1 and 2 in Example 1 are the same as those in Example 2, and thus illustration and detailed description will be omitted.

Figure 15:
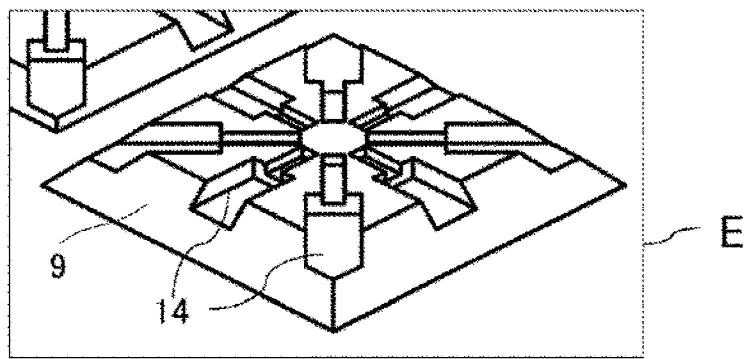
FIG. 15 is an enlarged view of a region E illustrated in FIG. 14.
Figure 16:
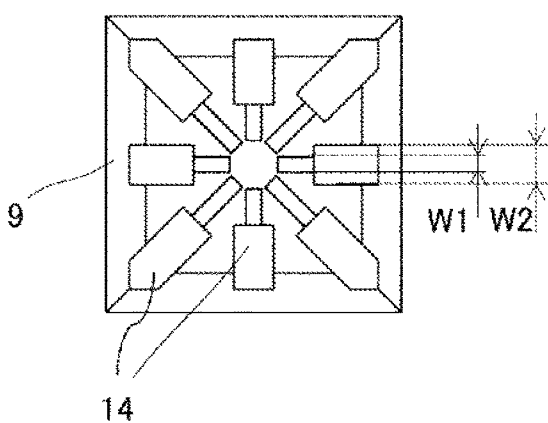
FIG. 16 is a top view of a heat dissipation pedestal of Example 3.
Figure 17:
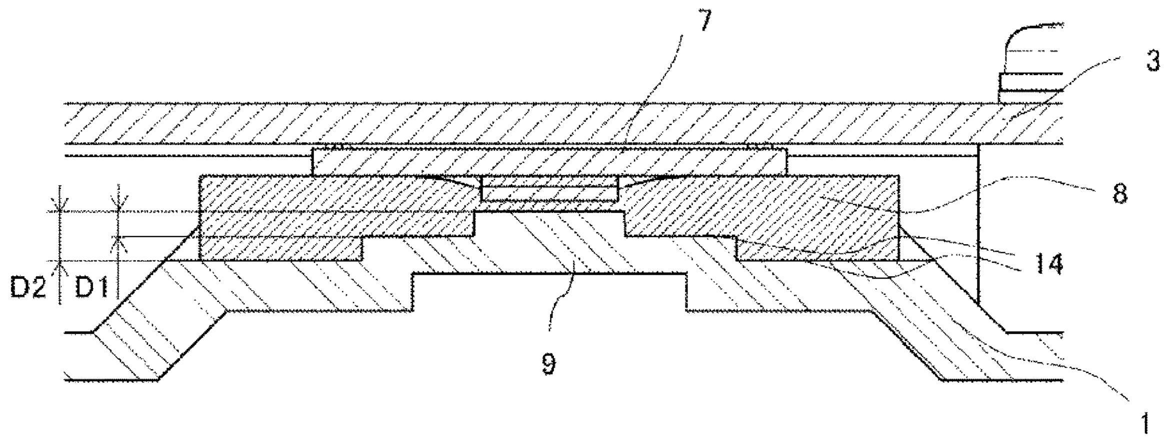
FIG. 17 is a partial cross-sectional view in a case where the electronic control device is assembled.

FIG. 15 is an enlarged view of the region E illustrated in FIG. 14, and FIG. 16 is a top view of the heat dissipation pedestal 9 of Example 3. FIG. 17 is a partial cross-sectional view in a case where the electronic control device 103 is assembled, and is a view illustrating the connection relationship among the electronic component 7, the thermally conductive material 8, the heat dissipation pedestal 9, and the groove 14.

Similarly to Example 2, Example 3 is characterized in that a groove 14 is further formed on a diagonal line e of the heat dissipation pedestal 9 in addition to the groove 14 formed on the heat dissipation pedestal 9 in Example 1. The further formed four grooves 14 are formed in a cross shape in a state of not being formed in a center region of the heat dissipation pedestal 9. Similarly to Example 2, eight grooves 14 in Example 3 are formed on the surface of the heat dissipation pedestal 9.

Furthermore, as illustrated in FIGS. 15 and 16, Example 3 is characterized in that a groove width W2 is larger than a groove width W1, where the groove width of the groove 14 is set such that the groove width W1 is on the upper surface inside (upper surface center side) and the groove width W2 is on the upper surface outside (upper surface peripheral side) of the heat dissipation pedestal 9 with respect to Example 2.

The reaction force of the thermally conductive material 8 increases as the thickness of the thermally conductive material 8 is thinned. During assembly, since the thermally conductive material 8 tends to push and expand to the outside of the heat dissipation pedestal 9, by expanding the groove width W2 on the outside, the thermally conductive material 8 easily moves to the outside in the groove 14, the heat dissipation area of the thermally conductive material 8 is expanded, the heat dissipation is improved, and the reaction force is further reduced.

A groove depth D2 is made deeper (larger) than a groove depth D1, where the depth of the groove 14 is set such that the groove depth D1 is on the upper surface inside and the groove depth D2 is on the upper surface outside of the heat dissipation pedestal 9.

That is, the cross-sectional area of the groove 14 is larger on the upper surface outside than on the upper surface inside of the heat dissipation pedestal 9. This can make it more difficult to transmit the stress generated by thermal deformation of the base 1 to the solder bump 11-*a* (illustrated in FIG. 13) at the corner end, and therefore it is possible to further improve the solder connection reliability of the electronic component 7.

Note that the groove width W2 on the outside is determined by the dimension of the width between the groove 14 and the groove 14 adjacent to each other.

According to Example 3, in addition to the same effects as those in Example 2, the solder connection reliability of the electronic component 7 can be further improved.

Example 4

Next, Example 4 of the present invention will be described.

Figure 18:
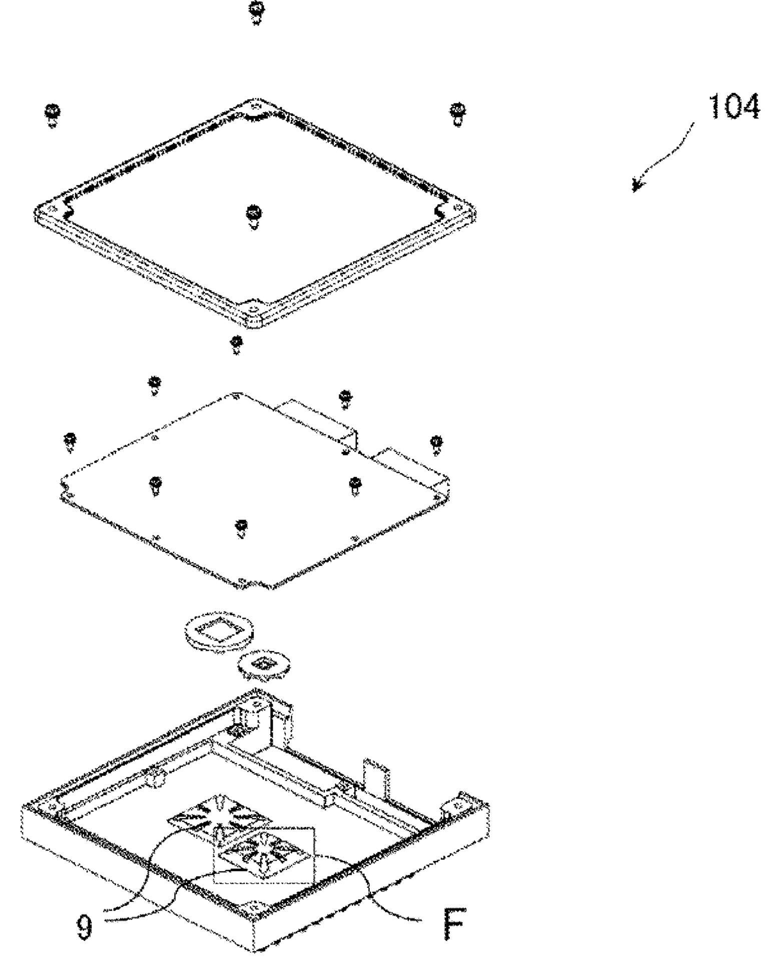
FIG. 18 is an exploded perspective view of an electronic control device in Example 4.

FIG. 18 is an exploded perspective view of an electronic control device 104 in Example 4 and corresponds to FIG. 3, which is an exploded perspective view in Example 1. In Example 4, FIGS. 1 and 2 in Example 1 are the same as those in Example 4, and thus illustration and detailed description will be omitted.

Figure 19:
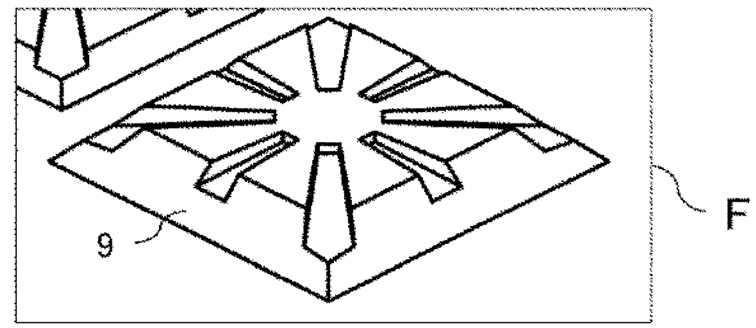
FIG. 19 is an enlarged view of a region F illustrated in FIG. 18.
Figure 20:
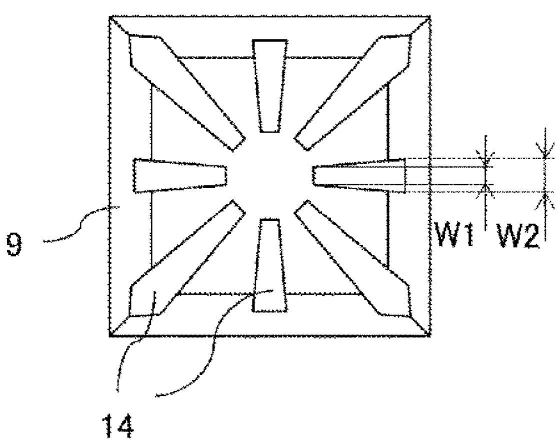
FIG. 20 is a top view of a heat dissipation pedestal of Example 4.
Figure 21:
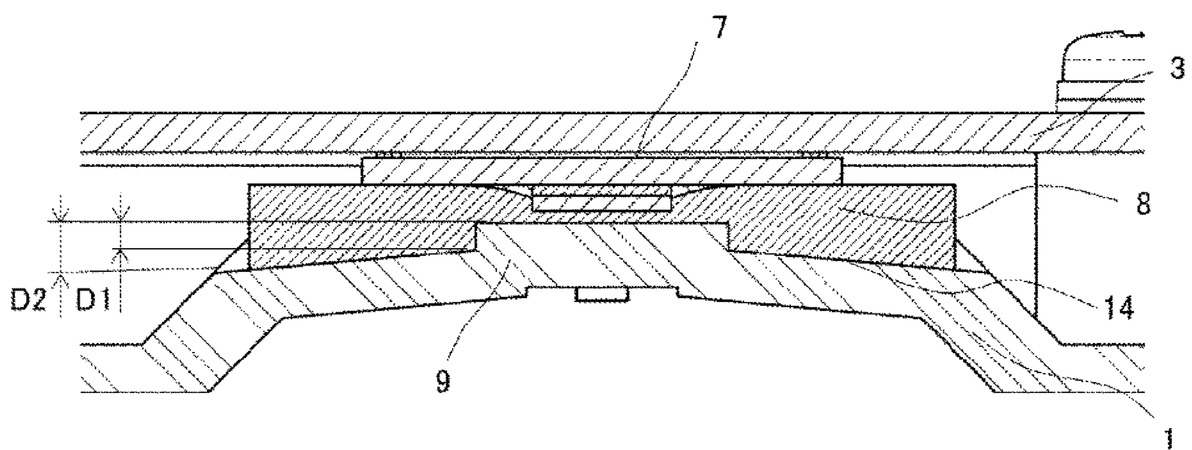
FIG. 21 is a partial cross-sectional view in a case where the electronic control device is assembled.

FIG. 19 is an enlarged view of the region F illustrated in FIG. 18, and FIG. 20 is a top view of the heat dissipation pedestal 9 of Example 4. FIG. 21 is a partial cross-sectional view in a case where the electronic control device 104 is assembled, and is a view illustrating the connection relationship among the electronic component 7, the thermally conductive material 8, the heat dissipation pedestal 9, and the groove 14.

Similarly to Example 2, Example 4 is characterized in that a groove 14 is further formed on a diagonal line e of the heat dissipation pedestal 9 in addition to the groove 14 formed on the heat dissipation pedestal 9 in Example 1. The further formed four grooves 14 are formed in a cross shape in a state of not being formed in a center region of the heat dissipation pedestal 9. Similarly to Example 2, eight grooves 14 in Example 4 are formed on the surface of the heat dissipation pedestal 9.

Furthermore, Example 4 is characterized in that, with respect to Example 2, the groove width of the groove 14 gradually increases from the groove width W1 of the upper surface inside of the heat dissipation pedestal 9 toward the groove width W2 of the upper surface outside of the heat dissipation pedestal 9, and the groove depth also gradually increases from the groove depth D1 of the upper surface inside of the heat dissipation pedestal 9 toward the groove depth D2 of the upper surface outside of the heat dissipation pedestal 9. That is, the cross-sectional area of the groove 14 is larger on the upper surface outside than on the upper surface inside of the heat dissipation pedestal 9.

This makes it easy for the thermally conductive material 8 to push and spread to the outside of the groove 14 during assembly, improves the heat dissipation, and further reduces the reaction force. Therefore, the solder connection reliability of the electronic component 7 can be further improved.

Note that in Example 4, the groove width W2 on the outside is determined by the dimension of the width between the groove 14 and the groove 14 adjacent to each other.

According to Example 4, in addition to the same effects as those in Example 2, the solder connection reliability of the electronic component 7 can be further improved.

Example 5

Next, Example 5 of the present invention will be described.

Figure 22:
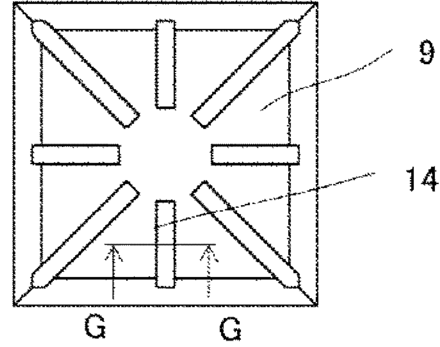
FIG. 22 is an explanatory view of an example different from Example 5.
Figure 23:
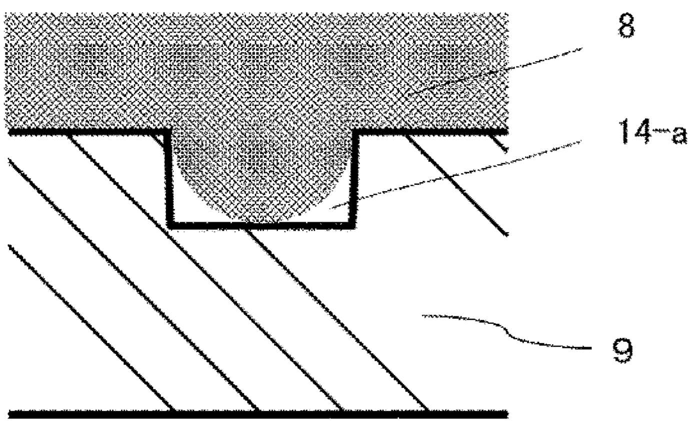
FIG. 23 is an explanatory view of an example different from Example 5.
Figure 24:
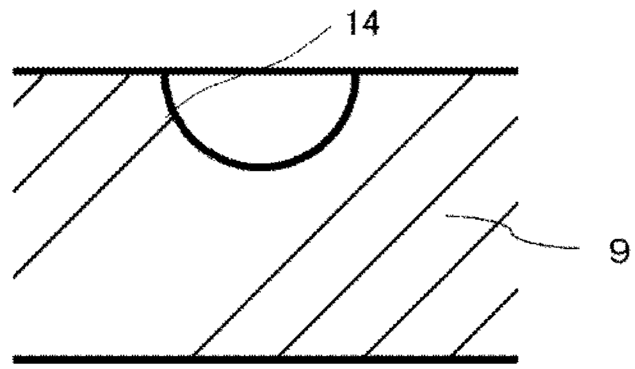
FIG. 24 is an explanatory view of an example of Example 5.
Figure 25:
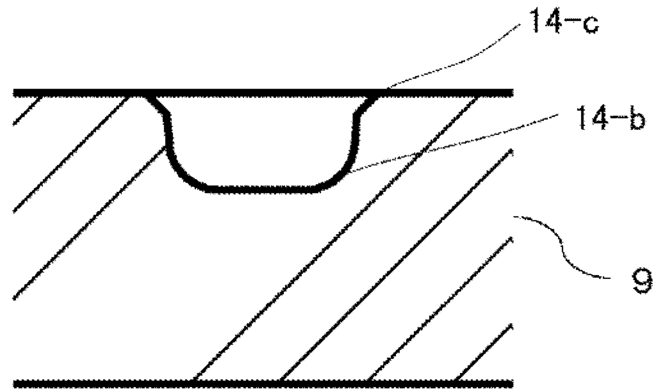
FIG. 25 is an explanatory view of another example of Example 5.

FIGS. 22 and 23 are explanatory views of an example different from Example 5, and FIGS. 24 and 25 are partial cross-sectional views of Example 5.

An exploded perspective view, an enlarged view, and a top view of the electronic control device according to Example 5 are similar to those of Example 2, and thus illustration and detailed description will be omitted.

FIG. 22 is a top view of the heat dissipation pedestal 9 in an example different from Example 5, and FIG. 23 is a cross-sectional view taken along line G-G of FIG. 22.

As illustrated in FIG. 23, in a case where the cross-sectional shape of the groove 14 is a quadrangle, the thermally conductive material 8 is less likely to enter a corner portion 14-*a* of the groove 14, the flow velocity of moving in the groove 14 in the outward direction of the heat dissipation pedestal 9 also decreases, and there is a possibility that the entire groove 14 cannot be filled.

As illustrated in FIG. 24, Example 5 is characterized in that the cross-sectional shape of the groove 14 is substantially semicircular. As long as the cross-sectional area is the same as that of the cross section illustrated in FIG. 23, as illustrated in FIG. 24, with the substantially semicircular shape without the corner portion 14-*a*, the thermally conductive material 8 can suppress a decrease in the flow velocity when moving in the groove 14 in the outward direction of the heat dissipation pedestal 9, and the entire groove 14 can become easily filled.

This makes it possible to fill the entire groove 14 with the thermally conductive material 8, ensure heat dissipation, reduce reaction force, and further improve the solder connection reliability of the electronic component 7.

The example illustrated in FIG. 24 is an example in which the groove 14 has a substantially semicircular shape, but may have an imperfect semicircular shape as illustrated in FIG. 25. The example illustrated in FIG. 25 is an example in which 14-b is added to the corner portion R of the groove 14 and a taper 14-*c* is added to the inlet of the groove 14. Also in the example illustrated in FIG. 25, effects similar to those in the example illustrated in FIG. 24 can be obtained.

The cross-sectional shape of the groove 14 is not limited to the semicircular shape, and may be an arc shape including the shape illustrated in FIG. 25.

Example 5 is applicable to each of Examples 1 to 4.

According to Example 5, in addition to the same effects as those in Examples 1 to 4, the solder connection reliability of the electronic component 7 can be further improved.

Note that although the four grooves 14 are formed in Example 1 and the eight grooves are formed in Examples 2 to 4, the number of grooves 14 is not limited to 4 and 8 and may be 5, 6, or 9 or more as long as a plurality of grooves 14 formed radially from the center of the upper surface of the heat dissipation pedestal 9 and where the thermally conductive material 8 enters are formed on the upper surface of the heat dissipation pedestal 9 on which the thermally conductive material 8 is arranged.

In Example 1, the number of grooves can be 2 as long as a plurality of grooves 14 formed radially from the center of the upper surface of the heat dissipation pedestal 9 and where the thermally conductive material 8 enters are formed.

In Examples 2 to 5, the two grooves 14 substantially parallel to the two sides of the heat dissipation pedestal 9 facing each other are formed via the center region of the heat dissipation pedestal 9, and the groove 14 is further formed on the diagonal line e of the heat dissipation pedestal 9. However, the two grooves 14 substantially parallel to the two sides of the heat dissipation pedestal 9 facing each other can be omitted, and only the groove 14 formed on the diagonal line e can be adopted. In this case, the number of grooves can be 2 as long as a plurality of grooves 14 formed radially from the center of the upper surface of the heat dissipation pedestal 9 and where the thermally conductive material 8 enters are formed.

In Example 4, either of the groove width or the groove depth of the groove 14 can be configured to gradually increase from the upper surface inside of the heat dissipation pedestal 9 toward the upper surface outside of the heat dissipation pedestal 9.

In Examples 1 to 5, the groove width W can be made at least 1.7 mm.

In Examples 1 to 5, the groove depth D can be made at least 0.7 mm.

In Examples 1 to 5, the ratio of the area of the plurality of grooves 14 which semiconductor chip 13 does not face via thermally conductive material 8 formed on the upper surface of the heat dissipation pedestal 9 to the area of the upper surface of the heat dissipation pedestal 9 is larger than the ratio of the area of the plurality of grooves 14 which semiconductor chip 13 faces via the thermally conductive material 8 formed on the upper surface of the heat dissipation pedestal 9 to the area of the upper surface of the heat dissipation pedestal 9. Preferably, the ratio of the area of the plurality of grooves 14 which semiconductor chip 13 faces via the thermally conductive material 8 formed on the upper surface of the heat dissipation pedestal 9 to the area of the upper surface of the heat dissipation pedestal 9 is equal to or less than 20%. Preferably, the ratio of the area of the plurality of grooves 14 which semiconductor chip 13 does not face via thermally conductive material 8 formed on the upper surface of the heat dissipation pedestal 9 to the area of the upper surface of the heat dissipation pedestal 9 is at least 15%.

In Examples 1 to 5, the plurality of grooves 14 are formed only on the upper surface of the heat dissipation pedestal 9 where the semiconductor chip 13 does not face via the thermally conductive material 8 formed on the upper surface of the heat dissipation pedestal 9.

REFERENCE SIGNS LIST

1 base
2 cover
3 circuit board
4 connector
5 board fixing screw
6 cover fixing screw
7 electronic component
8 thermally conductive material
9 heat dissipation pedestal
10 filler
11, 11-*a* solder bump
12 interposer
13 semiconductor chip
14 groove
14-*a* corner portion
14-*b* corner portion R
14-*c* taper
101, 102, 103, 104 electronic control device
t warpage
s heat dissipation clearance
e diagonal line
x lateral deformation length
y deformation length on diagonal line
W, W1, W2 groove width
D, D1, D2 groove depth

The invention claimed is:

1. An electronic control device comprising:

a circuit board mounted with an electronic component and a connector; a base housing the circuit board; a cover closing the base; a heat dissipation pedestal formed on the base; and a thermally conductive material arranged on an upper surface of the heat dissipation pedestal, wherein a plurality of grooves which is formed radially from a center of the upper surface of the heat dissipation pedestal and in which the thermally conductive material enters are formed on an upper surface of the heat dissipation pedestal on which the thermally conductive material is arranged, and the electronic component is in contact with the heat dissipation pedestal via the thermally conductive material, wherein a semiconductor chip is arranged on the electronic component, and a ratio of an area of the plurality of grooves which the semiconductor chip does not face via the thermally conductive material formed on the upper surface of the heat dissipation pedestal to an area of the upper surface of the heat dissipation pedestal is larger than a ratio of an area of the plurality of grooves which the semiconductor chip faces via the thermally conductive material formed on the upper surface of the heat dissipation pedestal to an area of the upper surface of the heat dissipation pedestal.

2. The electronic control device according to claim 1, wherein the thermally conductive material contains a filler, and when a volume ratio of the filler contained in the thermally conductive material to an entire volume of the thermally conductive material is ν (vol %), a groove width of each of the plurality of grooves is at least 0.06ν (mm).

3. The electronic control device according to claim 1, wherein the thermally conductive material contains a filler, and when a volume ratio of the filler contained in the thermally conductive material to an entire volume of the thermally conductive material is ν (vol %), a groove depth of each of the plurality of grooves is at least 0.008ν+0.5 (mm).

4. The electronic control device according to claim 1, wherein a groove of the plurality of grooves is formed on a diagonal line of the electronic component.

5. The electronic control device according to claim 1, wherein a cross-sectional area of a groove of the plurality of grooves is larger on an upper surface outside of the heat dissipation pedestal than on an upper surface inside of the heat dissipation pedestal.

6. The electronic control device according to claim 1, wherein a width of a groove of the plurality of grooves is larger on an upper surface outside of the heat dissipation pedestal than on an upper surface inside of the heat dissipation pedestal.

7. The electronic control device according to claim 1, wherein a groove depth of a groove of the plurality of grooves is larger on an upper surface outside of the heat dissipation pedestal than on an upper surface inside of the heat dissipation pedestal.

8. The electronic control device according to claim 1, wherein a width of a groove of the plurality of grooves gradually increases from an upper surface inside of the heat dissipation pedestal toward an upper surface outside of the heat dissipation pedestal.

9. The electronic control device according to claim 1, wherein a groove depth gradually increases from an upper surface inside of the heat dissipation pedestal toward an upper surface outside of the heat dissipation pedestal.

10. The electronic control device according to claim 1, wherein a groove width is at least 1.7 mm.

11. The electronic control device according to claim 1, wherein a groove depth is at least 0.7 mm.

12. The electronic control device according to claim 1, wherein the ratio of the area of the plurality of grooves which the semiconductor chip faces via the thermally conductive material formed on the upper surface of the heat dissipation pedestal to the area of the upper surface of the heat dissipation pedestal is equal to or less than 20%.

13. The electronic control device according to claim 1, wherein the ratio of the area of the plurality of grooves which the semiconductor chip does not face via the thermally conductive material formed on the upper surface of the heat dissipation pedestal to the area of the upper surface of the heat dissipation pedestal is at least 15%.

14. The electronic control device according to claim 1, wherein a semiconductor chip is arranged on the electronic component, and the plurality of grooves are formed only on the upper surface of the heat dissipation pedestal which the semiconductor chip does not face via the thermally conductive material formed on the upper surface of the heat dissipation pedestal.

15. The electronic control device according to claim 1, wherein a cross-sectional shape of a groove of the plurality of grooves is an arc shape.

* * * * *